US009841450B2

(12) United States Patent
Kikunaga et al.

(10) Patent No.: US 9,841,450 B2
(45) Date of Patent: Dec. 12, 2017

(54) STATIC ELECTRICITY DISTRIBUTION MEASURING APPARATUS AND STATIC ELECTRICITY DISTRIBUTION MEASURING METHOD

(71) Applicant: NATIONAL INSTITUTE OF ADVANCED INDUSTRIAL SCIENCE AND TECHNOLOGY, Tokyo (JP)

(72) Inventors: Kazuya Kikunaga, Saga (JP); Kazuhiro Nonaka, Saga (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 24 days.

(21) Appl. No.: 14/905,591

(22) PCT Filed: Mar. 13, 2014

(86) PCT No.: PCT/JP2014/056628
§ 371 (c)(1),
(2) Date: Jan. 15, 2016

(87) PCT Pub. No.: WO2015/011942
PCT Pub. Date: Jan. 29, 2015

(65) Prior Publication Data
US 2016/0154042 A1 Jun. 2, 2016

(30) Foreign Application Priority Data

Jul. 20, 2013 (JP) ................................ 2013-151185

(51) Int. Cl.
*G01R 29/12* (2006.01)
*G01R 29/24* (2006.01)
(Continued)

(52) U.S. Cl.
CPC ............. *G01R 29/24* (2013.01); *G01H 11/06* (2013.01); *G01R 29/0878* (2013.01);
(Continued)

(58) Field of Classification Search
CPC . H01L 21/00; H01L 2221/00; G06F 2101/00; G09G 1/00; G09G 2230/00
See application file for complete search history.

(56) References Cited

U.S. PATENT DOCUMENTS 6,414,297 B1 *  7/2002 Sasaki .................. G06F 3/0421
                                                   250/214 R
2006/0071669 A1 *  4/2006 Funato .............. G01R 29/0814
                                                   324/632
(Continued)

FOREIGN PATENT DOCUMENTS

EP      1 916 531 A1   4/2008
JP      S63-138374 A   6/1998
(Continued)

OTHER PUBLICATIONS

Extended European Search Report dated Jun. 20, 2016 in related European application No. 14830086.6 (7 pgs.).
(Continued)

*Primary Examiner* — Jermele M Hollington
*Assistant Examiner* — Temilade Rhodes-Vivour
(74) *Attorney, Agent, or Firm* — Foley & Lardner LLP

(57) ABSTRACT

A static electricity distribution measuring apparatus (1) according to the present disclosure measures the static electricity distribution on a measurement surface of a measurement target (200), and is provided with: an array antenna (2) that receives electric fields generated from each of a plurality of areas (211) on the measurement surface through vibration; a vibrator (3) that vibrates the measurement target (200) or the array antenna (2); a measurer (4) that measures
(Continued)

at least one from among intensity, frequency and phase of the electric fields in each of the plurality of areas (211) received by the array antenna (2); a calculator (5) that calculates an amount of static electricity for each of the plurality of areas (211) based on measurement results by the measurer (4); and a drawer (6) that draws the static electricity distribution on the measurement surface based on the amount of static electricity in each of the plurality of areas (211). The array antenna (2) has a plurality of antenna elements (21) respectively corresponding to the plurality of areas (211).

15 Claims, 11 Drawing Sheets

(51) Int. Cl.
| | |
|---|---|
| *G06F 1/00* | (2006.01) |
| *H01L 21/00* | (2006.01) |
| *G01R 29/14* | (2006.01) |
| *G01V 3/08* | (2006.01) |
| *G01R 29/08* | (2006.01) |
| *G06T 11/20* | (2006.01) |
| *G01H 11/06* | (2006.01) |

(52) U.S. Cl.
CPC .............. *G01R 29/14* (2013.01); *G01V 3/088* (2013.01); *G06F 1/00* (2013.01); *G06T 11/206* (2013.01); *H01L 21/00* (2013.01); *H01L 2221/00* (2013.01)

(56) References Cited

U.S. PATENT DOCUMENTS

| | | | |
|---|---|---|---|
| 2007/0170505 A1* | 7/2007 | Tokunaga | ........ G06K 19/07703 257/347 |
| 2009/0015263 A1* | 1/2009 | Nakajima | .......... G01R 19/0061 324/457 |
| 2012/0049189 A1* | 3/2012 | Sasaki | ............... H01L 29/78603 257/52 |
| 2012/0212874 A1* | 8/2012 | Fukada | ................... H01T 23/00 361/213 |

FOREIGN PATENT DOCUMENTS

| | | |
|---|---|---|
| JP | 2001-522045 A | 11/2001 |
| JP | 2006-098158 A | 4/2006 |
| JP | 2007-147549 A | 6/2007 |
| JP | 2013-003039 A | 1/2013 |
| WO | WO 2012/108258 A1 | 8/2012 |

OTHER PUBLICATIONS

International Search Report dated Jun. 17, 2014 in PCT/JP2014/056628 with English-language translation (4 pgs.).

Notification of Reasons for Refusal dated Jul. 18, 2017 in Japanese Appl. No. 2015-528162 with English-language translation (6 pgs.).

\* cited by examiner

FIG. 9

| INTENSITY<br>RELIABILITY<br>VALUE | | | | |
|---|---|---|---|---|
| 3 | 50 | 100 | 150 | 200 |
| 2 | 50 | 100 | 150 | 200 |
| 1 | 40 | 80 | 120 | 160 |
| 0 | 30 | 60 | 90 | 120 |
| | 20 | 40 | 60 | 80 |

AMOUNT OF STATIC ELECTRICITY

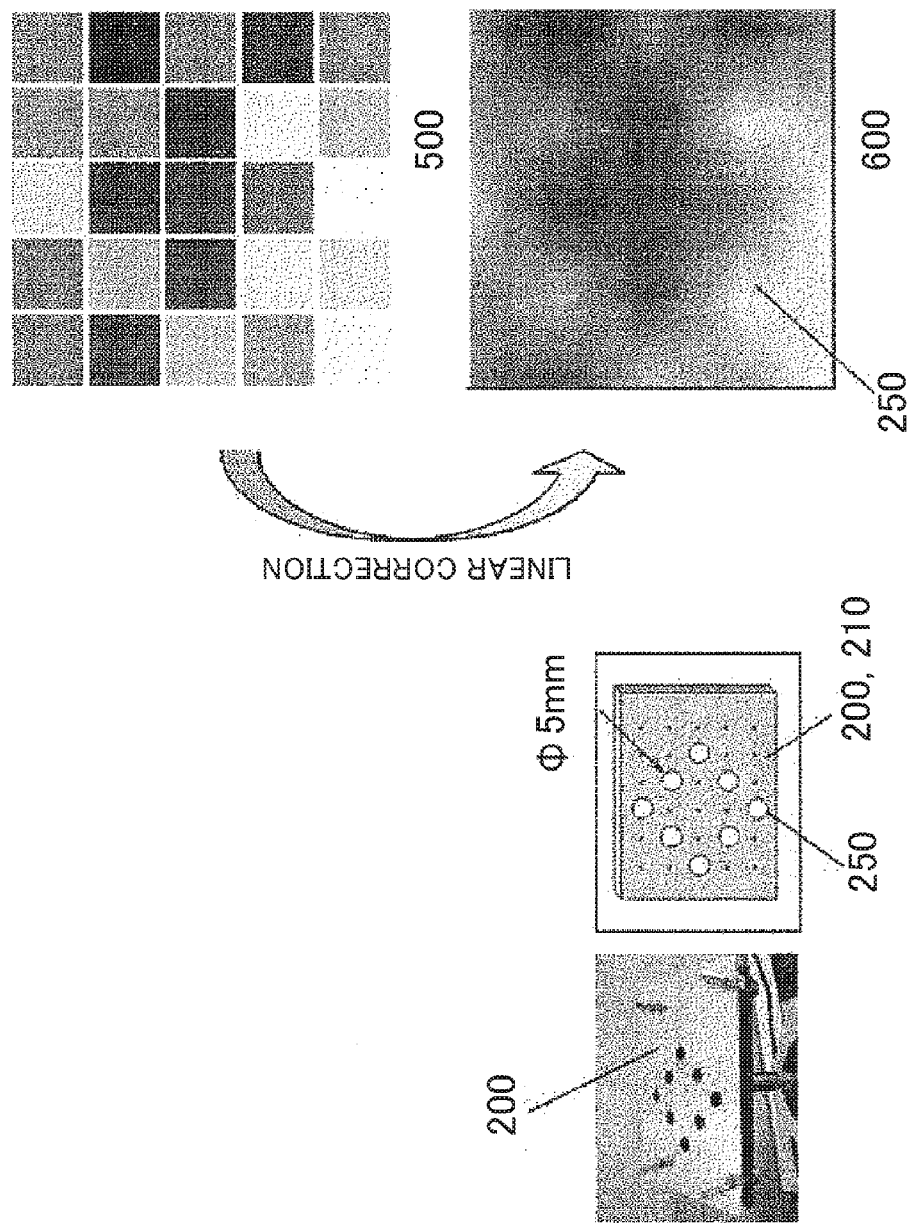

STATIC ELECTRICITY DISTRIBUTION MEASURING APPARATUS AND STATIC ELECTRICITY DISTRIBUTION MEASURING METHOD

TECHNICAL FIELD

The present invention relates to a static electricity distribution measuring apparatus and a static electricity distribution measuring method for measuring and making visible a static electricity distribution in a part or product used during a manufacturing process, in a variety of manufacturing sites for manufacturing semiconductors, electronic equipment, precision machinery, transportation machinery, chemical products, foodstuffs and/or the like.

BACKGROUND ART

Japan has a variety of manufacturing industries that support the foundations of industry, such as manufacturing of semiconductors, electronic equipment, precision machinery, transportation machinery, chemical products, foodstuffs and/or the like. In factories that take charge of actual manufacturing in these kinds of manufacturing industries, products are assembled through automated procedures or manual procedures while numerous parts flow along production lines.

When there are flaws or defects in parts used in manufacturing products, or when there are flaws or defects in manufacturing procedures, the products that are manufactured naturally have flaws or defects, and the problem arises that manufacturing yields decline. Or, even if there are no problems in parts, flaws or defects at times arise in products after manufacturing, for a variety of reasons. As problems relating to both the former and the latter, when operational flaws in various processes arise in automated manufacturing processes, the problems arise that manufacturing speed (manufacturing efficiency) declines and product manufacturing yields decline.

In the past, it was often the case, primarily at large companies, that the flow of processes including research, development, design, manufacturing, quality control and sales was vertically integrated. In a vertically integrated company, the response in development and design to insufficient quality or declining yields in manufactured products (finished products or semi-finished products) turned out at a manufacturing site took place in an environment in which feedback and feedforward were easy within the same company.

In contrast, in recent years companies have been spinning off manufacturing divisions (that is to say, manufacturing plants) due to problems with manufacturing costs, and manufacturing companies that undertake only subcontracted manufacturing have appeared. Similarly, fabless companies that undertake research and development alone and do not undertake manufacturing have prospered, particularly in the electric equipment field, the information communication field and/or the like.

In this manner, in manufacturing industries at present, in many cases there are physical, time, technological and human separations between the site where development and design are done and the site where actual manufacturing is done. When such separations exist, feedback and feedforward between the manufacturing site and the development site for quality deficiencies and declining yields at the manufacturing site are difficult. As a result of this difficulty, there are concerns that manufacturing capabilities are declining in Japan's manufacturing industry (including fabless companies, manufacturing subsidiaries, contract manufacturing companies that handle only manufacturing, and/or the like).

There are a variety of causes of deterioration in product quality and yields at manufacturing sites. There are inevitable causes such as simplicity in design and manufacturing, skill levels at the manufacturing site, the flow of manufacturing processes, manufacturing facilities, personal skills and/or the like, but one cause that tends to be overlooked is static electricity. That is to say, there are various causes of defects or flaws in parts, products or manufacturing processes, and one cause is thought to be static electricity.

At manufacturing plants, measures are taken so that static electricity does not have an effect on parts, products or manufacturing procedures, such as discharging electricity, preventing static electricity buildup in plant buildings, floors, walls and/or the like, and measures to prevent static electricity on workers' clothing, and/or the like, out of consideration for the negative effect of static electricity on parts, products, manufacturing procedures and/or the like. At an actual manufacturing plant, electric charge is eliminated on floors, walls, conveyor lines and/or the like prior to the start of work, and electrical grounds for eliminating electric charge are set up, but static electricity is generated inside the manufacturing plant and measures are taken to ensure that parts and products used in manufacturing procedures do not carry static electricity.

In addition, at manufacturing plants, measures are taken to discharge in advance parts used in manufacturing procedures. Similarly, measures are undertaken to ensure that workers also start work after eliminating electric charge.

In this manner, various measures have been implemented to reduce the negative effects of static electricity at manufacturing plants. Despite such measures, the problem that parts and products used in manufacturing procedures carry static electricity has not been completely resolved. For example, progress is being made in reducing power consumption by electronic equipment and precision equipment manufactured at manufacturing plants. Accompanying reductions in power consumption, parts used in manufacturing such electronic equipment and precision equipment are caused to have reduced capacity for discharging static electricity. Consequently, parts used in manufacturing such electronic equipment and precision equipment often carry static electricity and are easily damaged.

There are various types of parts used in manufacturing such electronic equipment and precision equipment. For example, numerous parts made of resin or vinyl (connectors, screen covers, housings and/or the like) are used. These parts have a certain size, and carrying static electricity, there are times when unpredictable behavior occurs. For example, a plurality of parts enter a procedure in which these parts flow along a conveyor line and are arranged at certain positions, or enter procedures for external appearance inspections by image processing. In these procedures, the plurality of parts introduced to the conveyor line preferably flow along the conveyor line with the introduced spacing maintained.

However, when such parts carry static electricity, movement is generated in the conveyor line as the parts draw closer to each other or are repelled from each other by static electricity. Depending on the case, adjacent parts could stick to each other. When such behavior occurs, the appropriate processes cannot be done in the above-described arrangement procedure or external appearance inspection procedure.

When this kind of unpredictable behavior occurs in such parts in the arrangement procedure and the external appearance inspection procedure, it is necessary to temporarily halt the conveyor line. Despite predictions that this behavior is caused by static electricity, as a countermeasure there is no alternative but to eliminate electric charge on the conveyor line, equipment for the procedures and furthermore all parts introduced to the conveyor line. When the conveyor line stops as a result of this charge-elimination work, a large loss is incurred in the manufacturing plant. That is because manufacturing work halts during the charge-elimination work (which, depending on the case, can take half a day or a full day).

It is understood that static electricity is the cause of such parts giving rise to the above-described behavior, but the mechanism leading to the actual behavior is virtually unexplained. In particular, there are times when different behaviors are exhibited, such as parts moving toward or away from each other and/or the like, and there are times when absolutely no behavior is exhibited. Consequently, explaining the mechanism leading to the behavior is difficult when it is not known how the static electricity that is (thought to be) building up on parts is distributed in the parts. If understanding the mechanism is difficult, it naturally follows that it is impossible to consider countermeasures to prevent the above-described behavior.

Or, covers made of resin, vinyl and/or the like attached to the screen of a mobile telephone handset, smartphone and/or the like readily carry static electricity based on the type of material and the size of the surface. When such parts are used in assembly procedures for electronic equipment or precision equipment, when the parts inevitably carry static electricity, there are cases in which arrangement positions arbitrarily shift because of the static electricity. When this occurs, the equipment being assembled naturally becomes flawed.

In this case as well, despite forecasts that the parts building up static electricity is the cause, the relationship between the behavior and static electricity buildup is unknown. When this relationship is unknown, it is impossible to try resolving the problem. That is to say, accurately understanding what causes this kind of buildup in static electricity is a prerequisite for resolving problems that occur in manufacturing procedures. Stated another way, in such parts, being able to confirm with what distribution static electricity is building up is a prerequisite condition for understanding the behavior of the parts.

Similarly, in equipment that uses static electricity, such as printers and/or the like, confirming static electricity distribution in parts that use static electricity buildup is necessary.

Thus, in the prerequisite of resolving various problems thought to originate from static electricity in manufacturing procedures, and in prerequisites to confirming the performance and properties of parts that use static electricity, it is desirable to measure the static electricity distribution on a part and/or the like and furthermore to make this visible.

As methods for measuring this kind of static electricity distribution, a number of technologies have been proposed (for example, see Patent Literature 1 or Patent Literature 2).

CITATION LIST

Patent Literature

Patent Literature 1: National Patent Publication No. 2001-522045
Patent Literature 2: Unexamined Japanese Patent Application Kokai Publication No. S63-138374.

SUMMARY OF INVENTION

Technical Problem

In static electricity measurements in the prior art, primarily the following five methods are proposed. However, these methods have problems noted below when it comes to static electricity measurements, particularly measuring static electricity in parts or products at manufacturing sites.

(Method 1) Faraday Cage

A Faraday cage houses a measurement target in a cage that can measure electric charge, and measures the amount of charge built up on the measurement target by regarding the measurement target as a capacitor and measuring the amount of static electricity thereon.

However, in the case of a Faraday cage, it is necessary to house the measurement target in the cage one at a time, so at a manufacturing site where tens of thousands to millions of electronic parts and machinery parts flow in succession on a line, this is unrealistic in practical use. The Faraday cage is suitable when the amount of static electricity on a small number of objects must be carefully measured, but is unsuitable in factories for electronic equipment, transportation equipment chemicals, foodstuffs and/or the like for which large-volume production is assumed.

(Method 2) Surface Electrometer

A surface electrometer measures the electric field on a measurement target by causing a probe to approach a surface of the measurement target, and measures the amount of static electricity.

However, when measuring the static electricity distribution using a surface electrometer, it is necessary to cause the sensor to scan, and large amounts of time are necessary. In addition, even when sensors are caused to run parallel in order to measure the static electricity distribution in a short time, because it is impossible to make a single sensor more compact, there is a problem in that it is impossible to obtain a high spatial resolution.

(Method 3) Method Using Pockels Effect

The Pockels effect is a phenomenon in which, when an external electric field is imposed on a conductive isotropic crystal, the refractive index of light changes in proportion to that electric field. Using this, a prescribed medium (Pockels crystal) is established on a surface of the measurement target, and the static electricity is measured by detecting the refractive index of reflected light and transmitted light when light is shone on the medium.

However, the Pockels effect requires a strong electric field to be impressed on the crystal and has low sensitivity, so in reality samples are caused to contact and it is impossible to measure any except samples with high electric potential. Hence, adaptation to making static electricity visible at research and development sites and production sites is unrealistic.

(Method 4) Method Using Kerr Effect

The Kerr effect is a phenomenon in which, when an external electric field is imposed on a material, the refractive index of light changes in proportion to the square of the electric field. By measuring this electro-optic property, it is possible to measure static electricity.

However, with the Kerr effect it is extremely difficult to detect changes and it is extremely difficult to measure the amount of static electricity on minute electronic parts and/or the like, making application at manufacturing sites difficult.

(Method 5) Scanning Probe Microscope

A scanning probe microscope measures the amount of static electricity while scanning the measurement target with a probe.

However, with a scanning probe microscope the labor required for the work is large, and there is also a problem in that the device is large.

Based on these methods, Patent Literature 1 discloses technology for measuring static electricity through a static electricity microscope (probe microscope).

However, when measuring static electricity using this kind of static electricity microscope, the device becomes large, so objects that can be measured are limited and environments where measurements can take place are limited. In addition, when applying the technology of Patent Literature 1 in an attempt to measure the static electricity distribution on the target object, it is necessary to take measurements by scanning the target object. When it is necessary to take measurements by scanning, considerable work time is naturally needed, and it is difficult to measure static electricity distribution on actual parts flowing on a conveyor line during manufacturing procedures.

That measurement through scanning takes time causes the problem to arise that it is impossible to respond to the fact that the charge status of static electricity changes during measurement. Consequently, there is a problem that it is impossible to accurately measure the static electricity distribution at a given instant.

Patent Literature 2 shines a light on the target object using an electrode and receives reflected light, and measures the static electricity of the target object based on the change therein. Even when the technology disclosed in Patent Literature 2 is applied to measurement of the static electricity distribution on the target object, scanning must be performed, posing the same problems as Patent Literature 1 stemming from the fact that scanning time is necessary.

In addition, the above-described surface electrometer can measure the static electricity of the target object in a separated state. However, in order to measure the static electricity distribution on the target object, it is necessary to scan the surface of the target object to take measurements, the same as with a probe microscope. That scanning is necessary poses the same problems as in Patent Literature 1 and 2. In addition, the surface electrometer is restricted to a minute area in the target object, making measurements difficult. That is because the surface electrometer measures the electric potential so as to pick out a broad range of the target object. Specifically, the surface electrometer measures the electric potential by broadening the range with respect of the target object.

Consequently, the surface electrometer has the problem of a low resolution in measurements. If the resolution is low, it is naturally impossible to measure an accurate static electricity distribution.

Thus, with the static electricity measuring methods of the prior art and art applying such, it was difficult to measure static electricity distributions in a short time with a high spatial resolution.

In consideration of the foregoing, it is an objective of the present disclosure to provide a static electricity distribution measuring apparatus that is a simple device and that measures the static electricity distribution on a target object in a short time with a high spatial resolution as a foundation.

Solution to Problem

In consideration of the foregoing, the static electricity distribution measuring apparatus according to the present disclosure is a static electricity distribution measuring apparatus for measuring a static electricity distribution on a measurement surface of a measurement target, the static electricity distribution measuring apparatus comprising: an array antenna that receives an electric field generated in each of a plurality of areas of the measurement surface through vibration; a vibrator that causes the measurement target or the array antenna to vibrate; a measurer that measures at least one from among intensity, frequency and phase of the electric field in each of the plurality of areas received by the array antenna; a calculator that calculates an amount of static electricity for each of the plurality of areas, based on measurement results by the measurer; and a drawer that draws a static electricity distribution on the measurement surface, based on the amount of static electricity in each of the plurality of areas; wherein the array antenna comprises a plurality of antenna elements respectively corresponding to the plurality of areas.

Advantageous Effects of Invention

The static electricity distribution measuring apparatus according to the present disclosure can measure the static electricity distribution on parts or products having a constant surface area, while having a simple construction. Furthermore, the static electricity distribution measuring apparatus can make the measured results visible so as to be easily comprehended.

In addition, the static electricity distribution measuring apparatus according to the present disclosure can make measurements in a short time, so it is possible to accurately measure properties of the static electricity distribution. Static electricity changes significantly with the passage of time, but using the present disclosure, measurement errors caused by fluctuations during measurement times decline. As a result, it is possible to measure the static electricity distribution on parts and products flowing on a manufacturing line at a manufacturing site, for example, in real time at that location.

BRIEF DESCRIPTION OF DRAWINGS

FIG. 9 is a table illustrating a relationship between a weighting and a calculated amount of static electricity in the second exemplary embodiment of the present disclosure;

FIG. 11 is an explanatory diagram showing the test status of the static electricity distribution according to the second exemplary embodiment of the present disclosure.

DESCRIPTION OF EMBODIMENTS

Figure 1:
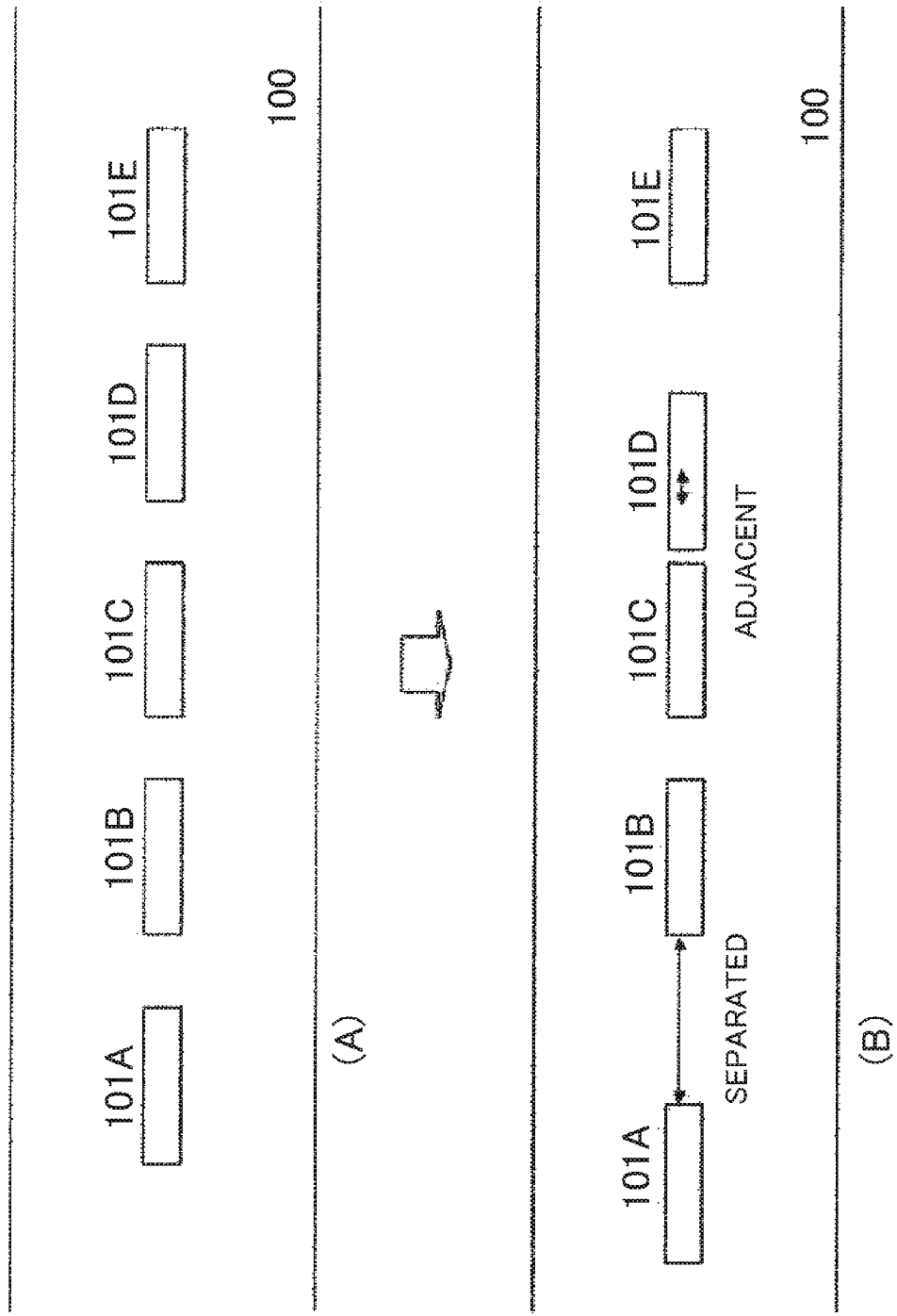
FIG. 1 is a schematic diagram explaining an exemplary problem.

The static electricity distribution measuring apparatus according to the first invention of the present disclosure is a static electricity distribution measuring apparatus for measuring a static electricity distribution on a measurement surface of a measurement target, the static electricity distribution measuring apparatus comprising: an array antenna that receives an electric field generated in each of a plurality of areas of the measurement surface through vibration; a vibrator that causes the measurement target or the array antenna to vibrate; a measurer that measures at least one from among intensity, frequency and phase of the electric field in each of the plurality of areas received by the array antenna; a calculator that calculates an amount of static electricity for each of the plurality of areas, based on measurement results by the measurer; and a drawer that draws a static electricity distribution on the measurement surface, based on the amount of static electricity in each of the plurality of areas; wherein the array antenna comprises a plurality of antenna elements respectively corresponding to the plurality of areas.

With this configuration, the static electricity distribution measuring apparatus can measure the static electricity distribution in analog, based on the amount of static electricity in each of finely partitioned areas, on the measurement surface of the measurement target.

With the static electricity distribution measuring apparatus according to the second invention of the present disclosure, in addition to the first invention, the measurement target is a product element of any out of electronic parts, electronic elements, semiconductor integrated elements, electronic substrates, electronic equipment, machinery parts, transportation equipment, chemical products, foodstuffs, paper products, ceramic materials, plastic materials, polymer materials, film products, rubber products, resin products, metal products, pharmaceuticals and textile products, used at a manufacturing site.

Through this configuration, the static electricity distribution measuring apparatus can measure the static electricity distribution in various parts or products used at the manufacturing site.

With the static electricity distribution measuring apparatus according to a third invention of the present disclosure, in addition to the first or second inventions, the product elements flow on a manufacturing line at the manufacturing site.

Through this configuration, information of resolution of problems caused by static electricity in parts or products flowing on the manufacturing line can be obtained.

With the static electricity distribution measuring apparatus according to a fourth invention of the present disclosure, in addition to any of the first through third inventions, the plurality of areas are provided virtually in the measurement surface, which is a surface facing the array antenna, in the measurement target.

Through this configuration, each of the antenna elements comprising the array antenna can receive and detect the electric field of the corresponding area.

With the static electricity distribution measuring apparatus according to a fifth invention of the present disclosure, in addition to the fourth invention, each of the plurality of areas is sectioned by areas facing the plurality of antenna elements provided in the array antenna.

Through this configuration, each of the antenna elements comprising the array antenna can receive and detect the electric field of the corresponding area.

With the static electricity distribution measuring apparatus according to a sixth invention of the present disclosure, in addition to the fifth invention, a surface area of each of the plurality of areas is determined based on a reception directionality of the antenna elements.

Through this configuration, if the convergence of the directionality of the antenna element is high, it is possible to receive the electric fields of a plurality of extremely fine areas. As a result, the static electricity distribution measuring apparatus can measure a highly precise static electricity distribution based on a finer partition.

With the static electricity distribution measuring apparatus according to a seventh invention of the present disclosure, in addition to any of the first to sixth inventions, the plurality of antenna elements is arranged in a prescribed lattice shape, and each of the plurality of areas is sectioned in correspondence with the prescribed lattice shape, in the measurement target.

Through this configuration, the static electricity distribution measuring apparatus can measure a more highly precise static electricity distribution, based on the amount of static electricity in the plurality of areas in the prescribed lattice shape.

With the static electricity distribution measuring apparatus according to an eighth invention of the present disclosure, in addition to any of the first through seventh inventions, each of the plurality of antenna elements possesses directionality convergent on the surface area of the plurality of areas.

Through this configuration, the static electricity distribution measuring apparatus can measure a highly precise static electricity distribution, based on the amount of static electricity in each of a plurality of finer areas.

With the static electricity distribution measuring apparatus according to a ninth invention of the present disclosure, in addition to any of the first through eighth inventions, the vibrator forms a state in which the measurement target and the array antenna vibrate relative to each other, by causing the measurement target to vibrate while the array antenna is in a fixed state, or by causing the array antenna to vibrate while the measurement target is in a fixed state.

Through this configuration, the vibrator can reliably generate an electric field through vibration.

With the static electricity distribution measuring apparatus according to a tenth invention of the present disclosure, in addition to any of the first through ninth inventions, the calculator calculates the amount of static electricity for each of the plurality of areas by calculating a reliability value based on a vibration amplitude of the measurement target or the array antenna, and weighting the reliability value by an electrical polarity calculated based on the phase of the electric field and the amount of static electricity calculated based on the intensity of the electric field.

Through this configuration, the calculator can calculate the amount of static electricity more accurately.

With the static electricity distribution measuring apparatus according to an eleventh invention of the present disclosure, in addition to the tenth invention, the reliability value is smaller when the vibration amplitude of the array antenna or the measurement target is smaller, and is larger when the vibration amplitude of the measurement target is larger.

Through this configuration, the calculator can calculate the amount of static electricity by efficiently using the reliability value.

With the static electricity distribution measuring apparatus according to a twelfth invention of the present disclosure, in addition to any of the first through eleventh inventions, the calculator calculates the amount of static electricity for each of the plurality of areas, as an absolute value of that area, and the drawer draws the static electricity distribution on the measurement surface of the measurement target by performing a prescribed interpolation on the amount of static electricity as absolute values in each of the plurality of areas.

Through this configuration, the drawer can make the amount of static electricity calculated for each of the plurality of areas an analog static electricity distribution.

With the static electricity distribution measuring apparatus according to a thirteenth invention of the present disclosure, in addition to the twelfth invention, the prescribed interpolation includes linear interpolation.

Through this configuration, the drawer can easily and reliably perform interpolation.

With the static electricity distribution measuring apparatus according to a fourteenth invention of the present disclosure, in addition to any of the first through thirteenth inventions, a display that displays the static electricity distribution on the measurement surface drawn by the drawer is further provided.

Through this configuration, the static electricity distribution measuring apparatus can display to the worker the static electricity distribution drawn.

Below, the exemplary embodiments of the present disclosure are described with reference to the drawings.

(Reference Explanation)

First, an example of problems that arise when various parts or products carry static electricity is described. FIG. 1 is a schematic diagram for explaining the exemplary problem. In FIG. 1, the condition when parts 101A to 101E are flowing on a manufacturing line 100 is illustrated. The parts 101A to 101E are used in manufacturing procedures or are objects of external appearance inspection, and thus flow on the manufacturing line 100. At this time, the plurality of parts 101 preferably flows maintaining a prescribed spacing for simplicity in external appearance inspections and appropriate processes in manufacturing procedures.

In FIG. 1A, each of the plurality of parts 101A to 101E is shown in a state flowing while maintaining a prescribed spacing or spacing close thereto.

However, there are times when, for one reason or another, the parts 101A to 101E have altered spacing as shown in FIG. 1B. For example, in FIG. 1B, part 101A and part 101B have repelled each other and become more separated. On the other hand, part 101C and part 101D have attracted each other and drawn closer together. If this kind of separation and closeness occur, naturally the spacing among the plurality of parts 101 changes. This change of spacing is not preferable in manufacturing procedures or external appearance inspections.

Static electricity is predicted to be the cause of the parts 101 separating from or approaching each other. By static electricity building up on the respective parts 101, it is thought that mutual repulsion or mutual attraction occurs. However, in reality it has not been clearly confirmed what kind of an effect static electricity has. Moreover, it is unknown under what conditions static electricity builds up on the respective parts 101. That is to say, it is thought that static electricity is building up on the parts 101, but with what kind of distribution the static electricity is building up has not been confirmed.

As a prerequisite to resolving these kinds of problems in manufacturing procedures, it is necessary to measure the static electricity distribution on the parts 101.

(Limits with Surface Electrometers)

Figure 2:
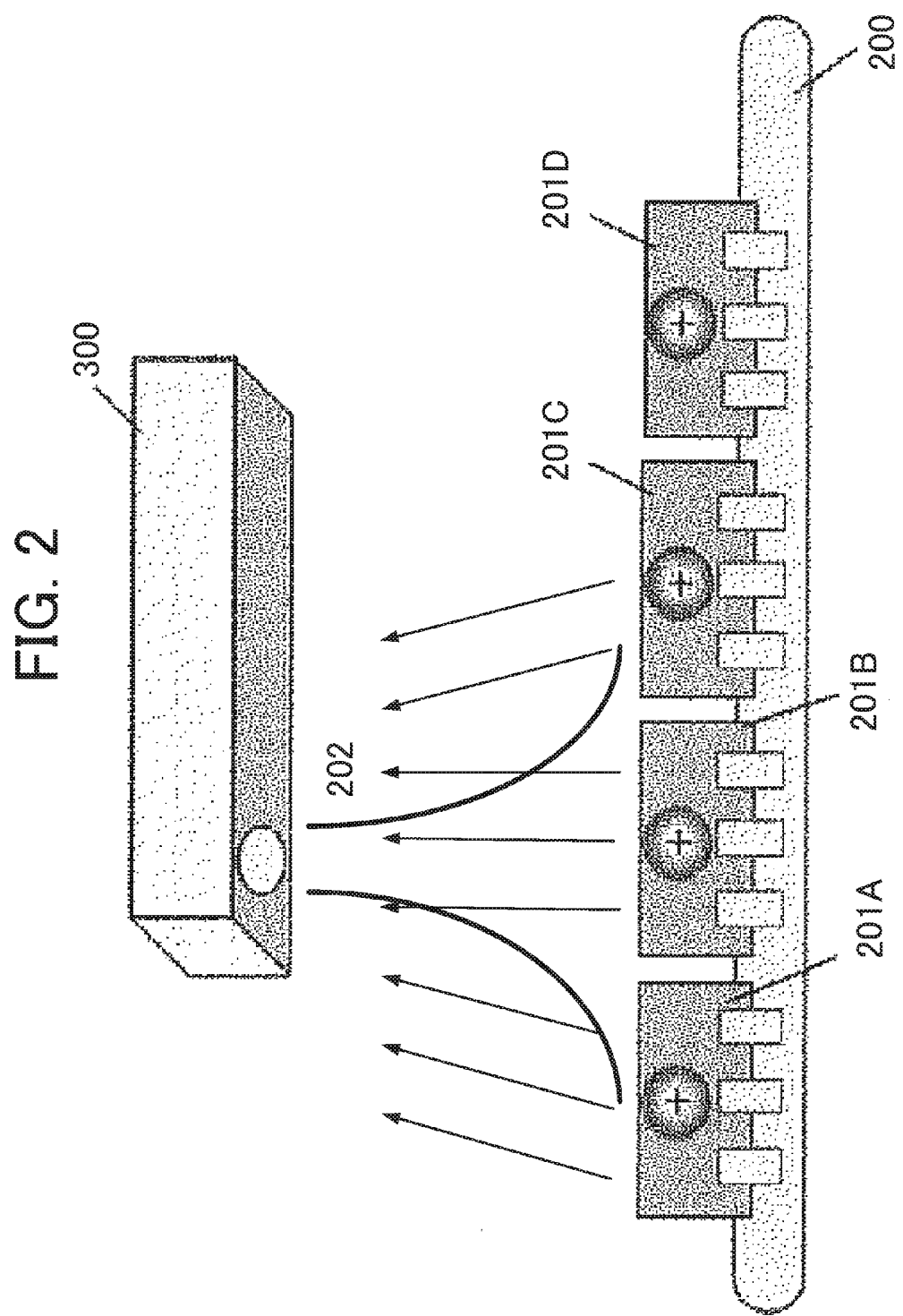
FIG. 2 is a schematic diagram illustrating the state of measuring the static electricity distribution on a measurement target 200 by a surface electrometer.

FIG. 2 is a schematic diagram illustrating the state of measuring the static electricity distribution on a measurement target 200 by a surface electrometer. As explained with the prior art, a surface electrometer 300 can measure the static electricity on a measurement surface of the measurement target 200 by measuring the electric potential from the measurement target. Here, suppose that the measurement surface of the measurement target 200 is virtually partitioned into a plurality of areas 201A to 201D, and the surface electrometer 300 measures the static electricity of each of the partitioned plurality of areas 201A to 201D. If the static electricity of each of the plurality of areas 201A to 201D is measured, it is possible to grasp the static electricity distribution on the measurement surface.

However, as shown in FIG. 2, the surface electrometer 300 causes the creation of an area under measurement 202 by broadening the measurement surface area in fan-like spreading, with respect to the measurement surface of the measurement target 200. Consequently, the area under measurement 202 becomes extremely large in the measurement surface, creating the problem that static electricity convergent on each of the plurality of areas 201A to 201D cannot be measured.

Naturally, static electricity should be measured in a given area 201, but the surface electrometer 300 makes measurements also including the static electricity of the adjacent areas 201. The surface electrometer measures the amount of static electricity as a scalar value, so the measured amount of static electricity is a value that includes not just the designated area 201 but also the amount of static electricity of the adjacent surrounding areas 201. In FIG. 2, the area under measurement 202 includes not just the area 201B (originally, this area 201B was the target) but also includes the adjacent areas 201A and 201C.

In this manner, the surface electrometer 300 is unable to measure the amount of static electricity for each of the plurality of areas necessary for measurement of the static electricity distribution, by precisely demarcating each of the areas 201. That is to say, the spatial resolution is low. As a result, naturally it is difficult to measure an accurate static electricity distribution for the measurement target 200.

(Scanning Probe Measurement)

Figure 3:
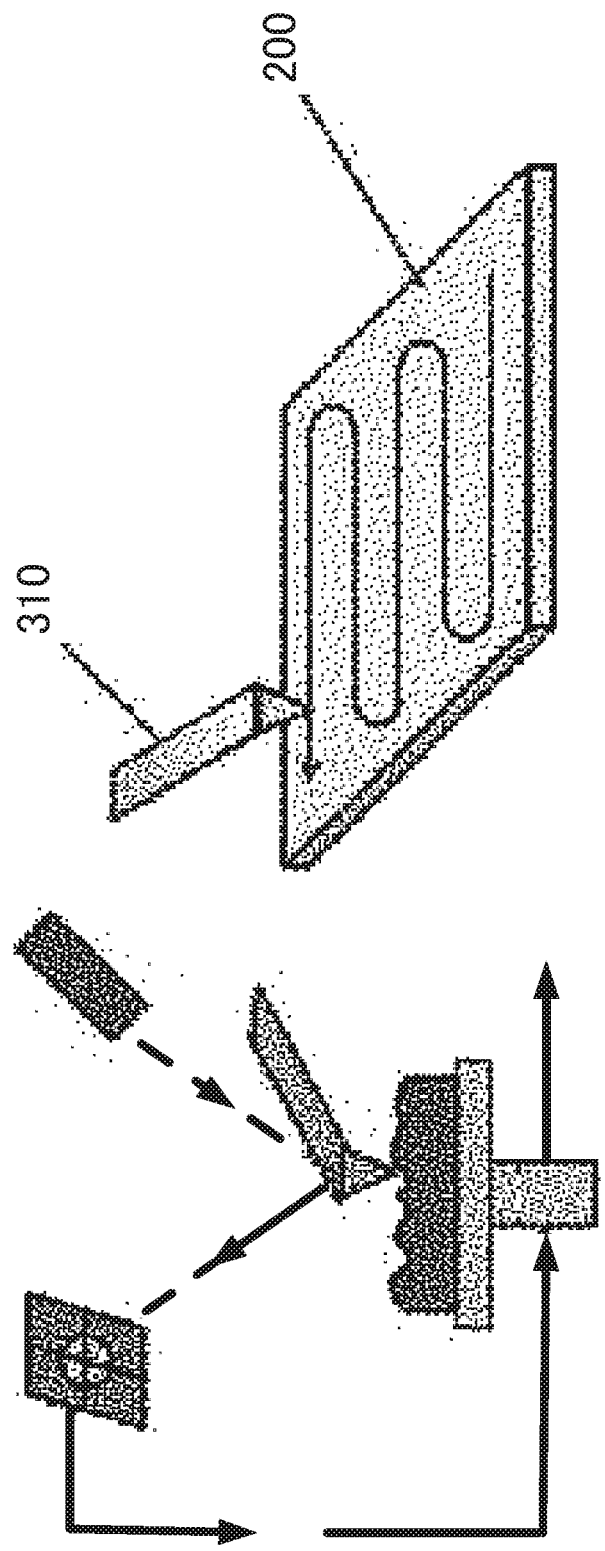
FIG. 3 is a schematic diagram of measuring the static electricity distribution on the measurement target 200 with a scanning probe measuring apparatus.

FIG. 3 is a schematic diagram of measuring the static electricity distribution on the measurement target 200 with a scanning probe measuring apparatus. A scanning probe 310 can measure the amount of static electricity at each position on the entirety of the measurement surface of the measurement target 200 by successively probing the surface of the measurement target 200. As a result, it is possible to measure the static electricity distribution on the measurement surface of the measurement target 200.

However, successively probing the entirety of the measurement surface is extremely time-consuming. In addition, probing is also extremely labor-intensive. Because the process is time-consuming, it is impossible to measure the correct static electricity distribution at a given moment. Consequently, even with a scanning probe measuring apparatus, it is difficult to measure an accurate static electricity distribution on the measurement target 200.

First Exemplary Embodiment

A first exemplary embodiment will be described.
(Complete Overview)

Figure 4:
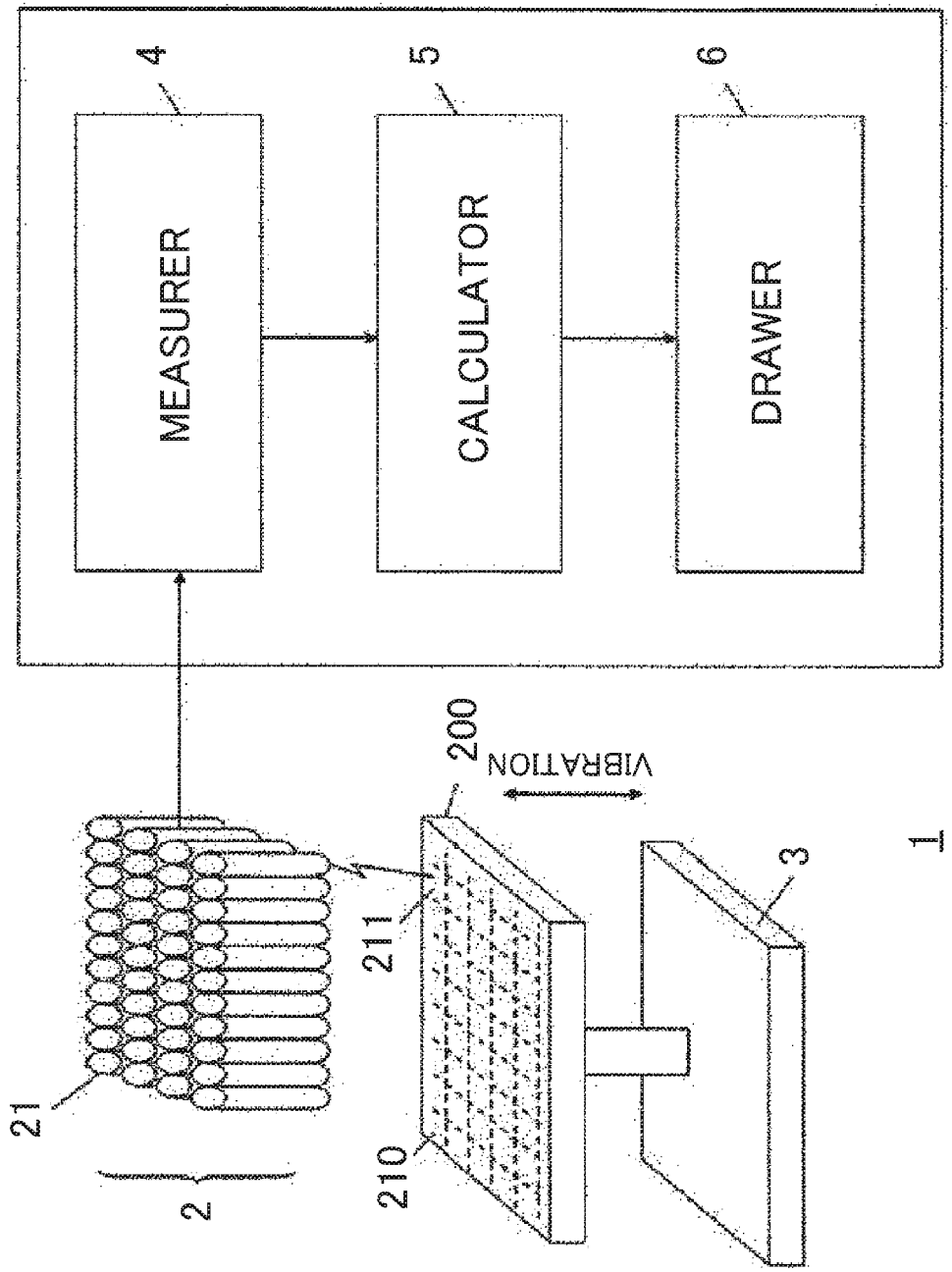
FIG. 4 is a block diagram of a static electricity distribution measuring apparatus according to a first exemplary embodiment of the present disclosure.

FIG. 4 is a block diagram of a static electricity distribution measuring apparatus according to a first exemplary embodiment of the present disclosure. A static electricity distribution measuring apparatus 1 measures a static electricity distribution on the measurement target 200.

The measurement target 200 is various parts or products with the potential for building up static electricity as described above. For example, the measurement target 200 is any out of electronic parts, electronic elements, semiconductor integrated elements, electronic substrates, electronic equipment, machinery parts, transportation equipment, chemical products, foodstuffs, paper products, ceramic materials, plastic materials, polymer materials, film products, rubber products, resin products, metal products, pharmaceuticals and textile products, used at a manufacturing site. Naturally, these are examples, and other parts or products may be the measurement target 200.

The static electricity distribution measuring apparatus 1 comprises an array antenna 2, a vibrator 3, a measurer 4, a calculator 5 and a drawer 6.

The vibrator 3 causes at least one out of the measurement target 200 and the array antenna 2 to vibrate. At this time, it is good if conditions are formed such that the measurement target 200 and the array antenna 2 vibrate relative to each other, so the vibrator 3 may cause only the measurement target 200 to vibrate, or may cause only the array antenna 2 to vibrate. Or, it would be fine if the vibrator 3 causes the measurement target 200 and the array antenna 2 to both vibrate, and forms conditions such that the two vibrate relative to each other.

The array antenna 2 comprises a plurality of antenna elements 21. The array antenna 2 receives an electric field generated by each of a plurality of areas 211 in a measurement surface 210 of the measurement target 200, by means of the antenna elements 21. The measurement target 200 has various shapes, but has a measurement surface 210 that is a surface facing the array antenna 2.

The array antenna 2 faces the measurement surface 210. Furthermore, each of the plurality of antenna elements 21 respectively faces the plurality of areas 211 arbitrarily and virtually sectioned on the measurement surface 210 of the measurement target 200. That is to say, each of the plurality of areas 211 is sectioned corresponding to an antenna element 21.

The measurement target 200 vibrates relative to the array antenna 2. As a result of the vibration, an electric charge vibration occurs and an electric field is generated. Each of the antenna elements 21 receives the electric field of the area 211 facing that element, of the plurality of areas 211. For example, a given antenna element 21 within the plurality of antenna elements 21 receives the electric field of the facing area 211.

The array antenna 2 comprises a plurality of antenna elements 21, so the array antenna 2 can receive electric fields generated by each of the plurality of areas 211, using the plurality of antenna elements 21. That is to say, the array antenna 2 can separately receive the electric field of each of the plurality of sectioned areas 211 facing the antenna elements 21, in the measurement surface 210.

The array antenna 2 transmits to the measurer 4 the electric fields of each of the plurality of areas 211 received by the respective antenna elements 21.

The measurer 4 measures at least one out of the intensity, the frequency and the phase of the electric fields in each of the plurality of areas 211. The electric fields have at least one element out of intensity, frequency and phase. The measurer 4 can measure at least one of the elements possessed by the electric fields received from the array antenna 2. The measurer 4 outputs to the calculator 5 at least one out of the intensity, frequency and phase measured.

The calculator 5 calculates the amount of static electricity or the electric polarity of the static electricity in each of the plurality of areas 211, based on the at least one out of the intensity, frequency and phase of the electric field received. For example, the calculator 5 can calculate the electric potential in a given area 211 of the plurality of areas 211, from the intensity of the electric field. The electric potential indicates the amount of static electricity of the area 211. That is to say, the calculator 5 can calculate the amount of static electricity of the area 211, based on the electric potential.

Or, the calculator 5 may calculate the amount of static electricity of the area 211, with the frequency and/or phase of the electric field included as one of parameters indicating the amount of static electricity.

In this manner, it is possible to separately calculate the amount of static electricity in each of the plurality of areas 211 sectioning the measurement surface 210 of the measurement target 200, by the array antenna 2 in which a plurality of antenna elements 21 are arranged.

The calculator 5 outputs the calculated amount of static electricity of each of the plurality of areas 211 to the drawer 6.

The drawer 6 draws the static electricity distribution on the measurement surface 210 based on the amount of static electricity in each of the plurality of areas 211. The amount of static electricity in each of the plurality of areas 211 calculated by the calculator 5 is nothing more than separately calculated. Because the amount of static electricity of each of the plurality of areas 211 is calculated as a scalar value, one of plurality of areas 211 can only be understood as a single value.

The drawer 6 can grasp a given area 211 not as a single value but as a value including change, by interpolating the amount of static electricity of that area 211 using the calculated amounts of static electricity of adjacent areas 211.

Figure 5:
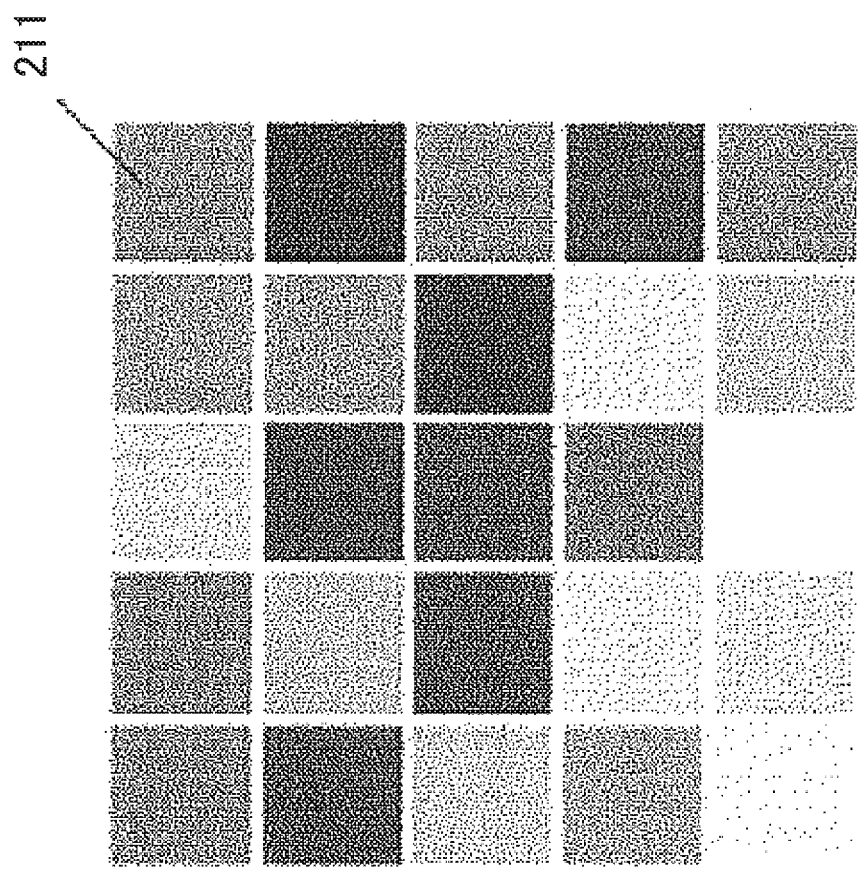
FIG. 5 is a schematic diagram illustrating the amount of static electricity in each of a plurality of areas 211, on a measurement surface 210 calculated by a calculator 5.

FIG. 5 is a schematic diagram illustrating the amount of static electricity in each of the plurality of areas 211 on the measurement surface 210 calculated by the calculator 5. The drawing shown in FIG. 5 makes visible the state calculated by the calculator 5, and illustrates the amounts of static electricity of each of the plurality of areas 211 of the measurement surface 210 of the measurement target 200.

The differences in colors illustrate the magnitudes of the values of the amounts of static electricity. This figure is the calculation result of the calculator 5 and is a drawing of the static electricity when this is replaced in the measurement target 200, but is not a drawing of the measurement target.

As can be seen from FIG. 5, the positive electricity amounts in each of the plurality of areas 211 calculated by the calculator 5 are independent values for each of the plurality of areas 211. Consequently, this is a state in which the amount of static electricity has been calculated as a single value in each of the plurality of areas 211.

Figure 6:
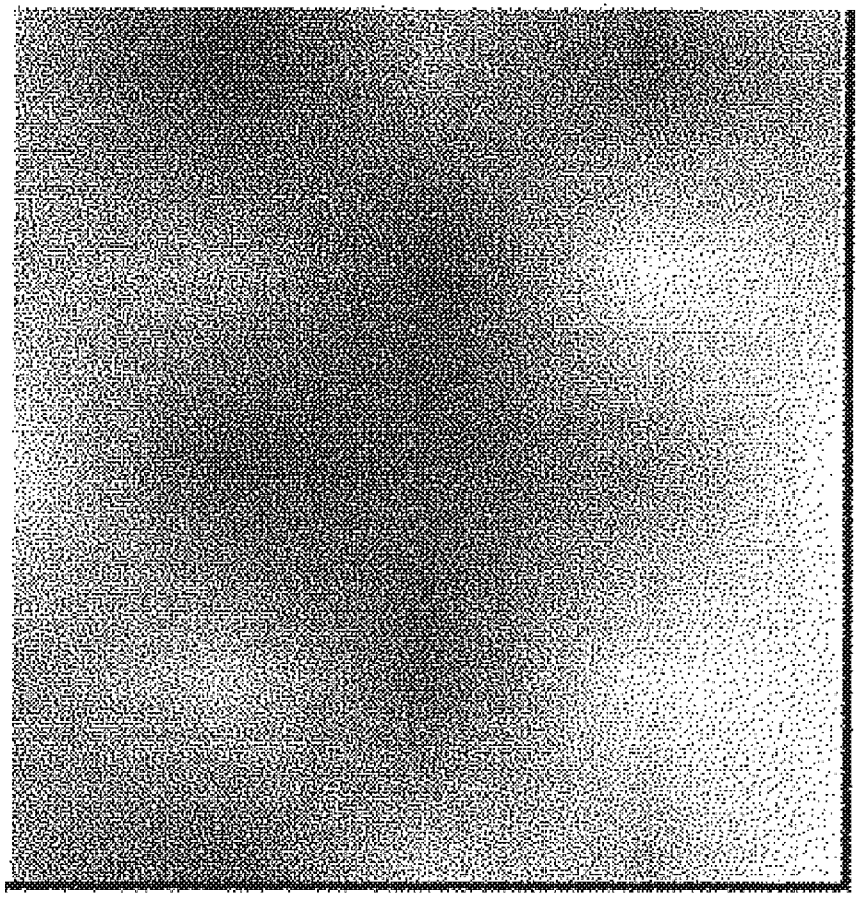
FIG. 6 is a schematic diagram illustrating a static electricity distribution drawn by a drawer according to the first exemplary embodiment of the present disclosure.

From this state, when a process such as a prescribed interpolation and/or the like is performed by the drawer 6, the analog distribution on the amount of static electricity can be understood. FIG. 6 is a schematic diagram illustrating a static electricity distribution drawn by the drawer according to the first exemplary embodiment of the present disclosure. As shown in FIG. 6, the drawing has changed from a display of digital static electricity amounts in each of the plurality of areas 211 to a display in which a completely analog distribution can be understood.

The static electricity distribution measuring apparatus 1 can measure the analog static electricity distribution on the measurement surface 210 of the measurement target 200 through the static electricity distribution diagram drawn by the drawer 6. This analog static electricity distribution can be thought of as illustrating the static electricity distribution more realistically. That is to say, the state shown in FIG. 6 is the static electricity distribution on the measurement target 200 as measured by the static electricity distribution measuring apparatus 1.

In this manner, the static electricity distribution measuring apparatus 1 can measure the static electricity distribution on product elements flowing or potentially flowing along a manufacturing line, such as various parts or products.

Next, details of the various components are described.

(Measurement Target)

The measurement target 200 is various parts or products for which it is thought not preferable that the effects of static electricity be received, as noted above.

The static electricity distribution measuring apparatus 1 measures the static electricity distribution on the measurement target 200. To that end, the measurement target 200 vibrates relative to the array antenna 2, by means of the vibrator 3. Through this vibration, the measurement target 200 is caused to generate an electric field based on virtual electric charge vibrations.

Regardless of what shape the measurement target 200 has, the measurement target 200 has a surface facing the array antenna 2. This facing surface becomes the measurement surface 210 that is the object of measurement. The static electricity distribution measuring apparatus 1 has as its objective displaying the static electricity distribution on the measurement surface 210 as an analog distribution diagram. To this end, the array antenna 2 faces the measurement surface 210 and receives the electric field generated through vibration.

At this time, in order to measure the static electricity distribution as a distribution diagram, the array antenna 2 receives the electric field with the measurement surface 210 divided into a plurality of areas 211 that are a plurality of divisions. Consequently, the measurement surface 210 of the measurement target 200 is virtually sectioned into a plurality of areas 211 that are a plurality of divisions. Naturally, the plurality of areas 211 is for convenience in measuring the static electricity distribution, so sectioning lines are not actually drawn on the measurement surface 210.

The finer the plurality of areas 211 is, the more precisely the static electricity distribution on the measurement surface 210 can be measured. However, it is necessary for the separate amount of static electricity of the respective areas 211 of the plurality of areas 211 to be accurately calculated. With the static electricity distribution measuring apparatus 1 according to the first exemplary embodiment, this is resolved by the array antenna 2 and vibration of the measurement target 200.

Consequently, each of the plurality of areas 211 is sectioned by a range facing the plurality of antenna elements 21 with which the array antenna 2 is provided. That is to say, the range that each of the antenna elements 21 faces is one area 211 of the plurality of areas 211. Consequently, the range of each of the plurality of areas 211 partitioned in the measurement surface 210 is determined by the performance (primarily the spatial resolution) of the antenna elements 21.

Consequently, the number of the plurality of areas 211 is determined by the number of antenna elements 21 of the array antenna 2.

In addition, for the same reason, the surface area of each of the plurality of areas 211 is determined based on the reception directionality of the antenna elements 21. More precisely, the surface area of each of the plurality of areas 211 is determined by the spatial resolution of the antenna elements 21.

As noted above, the plurality of areas 211 is formed virtually in the measurement surface 210 based on the number, spacing, performance and/or the like of the antenna elements with which the facing array antenna 2 is provided.

The measurement target 200 is an object for which measurement of the amount of static electricity is to be received. It is various parts or products flowing on a factory line and/or the like. In particular, it is various parts or products that have the potential of building up static electricity. For example, the measurement target 200 is any out of electronic parts, electronic elements, semiconductor integrated elements, electronic substrates, electronic equipment, machinery parts, transportation equipment, chemical products, foodstuffs, paper products, ceramic materials, plastic materials, polymer materials, film products, rubber products, resin products, metal products, pharmaceuticals and textile products, used at a manufacturing site. Naturally, this and/or the like are examples, and parts or products other than these may also be the measurement target 200.

For example, at a manufacturing site in the field of semiconductors or liquid crystals, the measurement target 200 is an item flowing on a manufacturing line, such as a component package, electronic components, semiconductor integrated components, semiconductor wafers, liquid crystal glass materials and/or the like, or a work subject such as a device, packaging materials, or worker. In addition, at a manufacturing site in the electrical equipment or electronics field, the measurement target 200 is an electronic component, electronic element, electronic substrate or electronic equipment, or is a device or packaging materials.

In addition, at a manufacturing site in the field of chemical products, the measurement target 200 is a chemical product, a textile product, a film product and/or the like. At a manufacturing site in the foodstuffs or pharmaceuticals field, the measurement target 200 is a foodstuff, pharmaceutical, insulating material, device and/or the like. At a manufacturing site in the resin or film field, the measurement target 200 includes resin products, resin materials, film products, film materials and/or the like, as well as insulating materials and/or the like. Similarly, in the field of machinery or transportation equipment, the measurement target 200 includes machinery parts, transportation equipment, electrically conductive materials, packages, and/or the like. In addition, at a manufacturing site in the field of paper or textile products, the measurement target 200 includes paper and textile products. At a manufacturing site in the metals field, the measurement target 200 includes metal products, metal materials and/or the like.

(Array Antenna)

The array antenna 2 is an aggregation of a plurality of antenna elements 21. The plurality of antenna elements 21 faces the measurement surface 210 of the measurement target 200. Through this facing, each of the antenna elements 21 respectively faces a virtually sectioned area 211.

Each of the antenna elements 21 has a directionality convergent on the respective surface area of the plurality of areas 211. That is to say, the antenna element 21 has a directionality having a high convergence, and has a directionality that converges on the area 211 that is the facing surface and receives the electric field thereof. Through this directionality, the antenna element 21 can converge and receive the electric field of each of the areas 211 of the facing plurality of areas 211, in the electric field generated through the measurement target 200 vibrating.

For example, if the diameter of the antenna element 21 is small and the protrusion of the conductor at the tip is short, the directionality of the antenna 21 tends to converge in a facing narrow area. Through this convergence, the antenna 21 can intensively receive the electric field of a given area 211. By also receiving the electric field of areas 211 other than the facing given area 211, it is possible to prevent declines in reception precision.

In this manner, the array antenna 2 has a high spatial resolution through the array antenna 2 that is an aggregation of a plurality of antenna elements 21. Through this high spatial resolution, it is possible to receive the electric fields of each of the areas 211 in a state with the measurement surface 210 of the measurement target 200 partitioned into finer areas 211. Through this, by receiving electric fields of the measurement surface 210 partitioned into finer areas 211, the static electricity distribution measuring apparatus 1 can measure a more detailed static electricity distribution in the measurement surface 210.

The plurality of antenna elements 21 is ideally arranged in a prescribed lattice shape. That is to say, the array antenna 2 is an aggregation of the plurality of antenna elements 21 arranged in a prescribed lattice shape. In this case, the sectioning of the plurality of areas 211 of the measurement surface 210 is determined in conjunction with the plurality of antenna elements 21 arranged in the prescribed lattice shape.

Naturally, it is fine if the plurality of antenna elements 21 is arranged in a shape other than a lattice shape. Even in such a case, the plurality of areas 211 may be sectioned in conjunction with the arrangement method of the plurality of antenna elements 21.

The array antenna 2 may be provided as a member independent of the members with which the calculator 5 and/or the like is provided, or may be provided included in the same member.

(Vibrator)

The vibrator 3 causes the array antenna 2 and the measurement target 200 to vibrate relative to each other. Consequently, the vibrator 3 may cause the measurement target 200 to vibrate with the array antenna 2 in a fixed state. Or, the vibrator 3 may cause the array antenna 2 to vibrate with the measurement target 200 in a fixed state. Or, the vibrator 3 may cause both the measurement target 200 and the array antenna 2 to vibrate. Through any of these, the vibrator 3 can cause the array antenna 2 and the measurement target 200 to vibrate relative to each other.

(Measurer)

The measurer 4 measures at least one out of the intensity, frequency and phase of the electric field output by the array antenna 2. The electric field has elements of intensity, frequency and phase. Each of these elements indicate the electric potential of the charge (this electric charge is the electric charge generated by the buildup of static electricity) that is the source of the electric field or the sign (positive or negative) thereof.

The measurer 4 measures the intensity of the electric field received by performing data processing. It is also possible to measure the frequency or the phase also, by converting time frequency as necessary. Measurement of the intensity, frequency and phase by the measurer 4 may be done using commonly known technology, so a description of details is omitted here. It would also be fine to use general signal processing.

The measurer 4 may measure all of the intensity, frequency and phase, or may measure one of those, as necessary. Naturally, it would be fine to also measure a plurality of these elements. The measurer 4 outputs the measured results to the calculator 5. To that end, the measurer 4 and the calculator 5 are electrically connected. The electrical connection may be realized by a network connection, with wires or wirelessly.

(Calculator)

The calculator 5 calculates the amount of static electricity of the area 211 based on at least one out of the intensity, frequency and phase of the electric field that is the measurement result output from the measurer 4. At this time, the measurer 5 may calculate the amount of static electricity based on any one out of the intensity, frequency and phase, or may calculate the amount of static electricity based on a combination of a plurality of elements among the intensity, frequency and phase.

In any case, the intensity, frequency and phase of the electric field are indicators indicating the state of the generated static electricity, and the calculator 5 can estimate the electric potential of the static electricity and the sign thereof, based on these elements.

(Calculation Based on Correspondence Relationship Equation)

The calculator 5 can calculate the amount of static electricity of the area 211, based on a correspondence relationship equation between the intensity of the electric field and the amount of static electricity. For example, a correspondence relationship equation indicating the correspondence relationship between the electric field intensity and the amount of static electricity is set in advance.

The calculator 5 calculates the amount of static electricity of the area 211 by inserting the value of the electric field into the correspondence relationship equation. At this time, it is possible to calculate the amount of static electricity of the plurality of areas 211, from the electric fields of each of the plurality of areas 211. As a result, it is possible to calculate the amount of static electricity in each of the plurality of areas 211 sectioned in the measurement surface 210. The calculation result is imaged as shown in FIG. 5.

(Calculation Using Relationship Table)

In addition, the calculator 5 may calculate the amount of static electricity based on a relationship table indicating the correspondence relationship between the intensity of the electric field and the amount of static electricity. Unlike the correspondence relationship equation, the calculation is based on discrete values, but this has the advantage that the processing burden is small. A relationship table can be changed or updated with experience, and the calculator 5 can calculate the amount of static electricity with greater precision, in accordance with the accumulation of use.

The relationship table, similar to the correspondence relationship equation, may be stored in a memory with which the calculator 5 is provided. The memory may be provided in the calculator 5, or may be memory common to the calculator 5 and other elements.

In addition, the calculator 5 may calculate the amount of static electricity based on at least one out of the correspondence relationship equation and the relationship table, and may appropriately select whether to use according to properties of the measurement target 200 or the properties of the measurement site. In addition, depending on the case, the calculator 5 may calculate the amount of static electricity using both the correspondence relationship equation and the relationship table.

In addition, the correspondence relationship equation and the relationship table here indicate a relationship between the intensity of the electric field and the amount of static electricity, but it would be fine for these to indicate the relationship between the frequency or the phase of the electric field and the amount of static electricity.

In addition, it would also be suitable for the calculator 5 to calculate the amount of static electricity after correcting the elements dependent on frequency by substituting the intensity in the correspondence relationship equation or the relationship table, after making corrections by means of the frequency.

In addition, the explanation was for a case in which the calculator 5 calculates the amount of static electricity based on at least one of the correspondence relationship equation and the relationship table, based on the intensity of the electric field, but it may calculate the amount of static electricity based on at least one of the correspondence relationship equation and the relationship table, based on the frequency of the electric field.

In addition, the calculator 5 may calculate the amount of static electricity by making corrections based on the frequency.

(Drawer)

The drawer 6 draws the static electricity distribution on the measurement surface 210, based on the amount of static electricity of each of the plurality of areas 211 calculated by the calculator 5. The amount of static electricity of each of the plurality of areas 211 calculated by the calculator 5 is the amount of static electricity as a single value for each of the areas 211. That is to say, this is the state shown in FIG. 5.

In this state, this is nothing more than the absolute value of each section, based on the surface area of the area 211, being displayed. Even so, this becomes an indicator as one example of the static electricity distribution, but this is stopped at a level of being a digital discrete value for each section of the area 211. Consequently, this is insufficient in order to grasp the static electricity distribution over the measurement surface 210 as a whole in a more analog fashion. This is because the amount of static electricity for each of the areas 211 shown in FIG. 5 is the single absolute value of the amount of static electricity in the area 211.

The drawer 6 draws a static electricity distribution chart indicating the analog, continuous static electricity distribution over the measurement surface 210 as a whole, as shown in FIG. 6, by performing a prescribed interpolation based on the values of the amount of static electricity in each of the areas 211 (state shown in FIG. 5).

The prescribed interpolation is an interpolation of the amount of static electricity in a given area 211 using the amount of static electricity of the surrounding areas 211, to correct the value of the amount of static electricity in the given area 211. In this correction, it would be fine to correct not as the area 211 as a whole but to correct the area 211 in a state more finely sectioned. Through this kind of correction, a more continuous drawing of the static electricity distribution in the measurement surface 210 is realized.

For the interpolation, linear interpolation may be used, for example. Naturally, it would be fine to use various interpolation methods other than linear interpolation. By using interpolation, a continuous static electricity distribution chart such as that shown in FIG. 6 is obtained.

This kind of static electricity distribution in the measurement surface 210 of the measurement target 200 ultimately shows the static electricity distribution on the measurement target 200. In this manner, by obtaining the static electricity distribution, as explained using FIG. 1, it is thought to be possible to find the source of inexplicable behavior thought to be based on static electricity buildup in parts or products.

For example, by being able to measure the static electricity distribution as shown in FIG. 6, it becomes possible to find the source of inexplicable behavior of parts or products that are objects under measurement 200. If it becomes possible to find the source of this behavior, it is possible to anticipate that various problems can be resolved in manufacturing procedures, inspection procedures and/or the like, starting with the kind of problems described in FIG. 1.

Above, the static electricity distribution measuring apparatus 1 according to the first exemplary embodiment can accurately and with greater precision measure the static electricity distribution on the measurement target 200. Utilizing the measurement results, it is possible to resolve the source of inexplicable behavior of parts or products thought to be the source of static electricity buildup.

Second Exemplary Embodiment

Next, a second exemplary embodiment will be described.
(Display)

Figure 7:
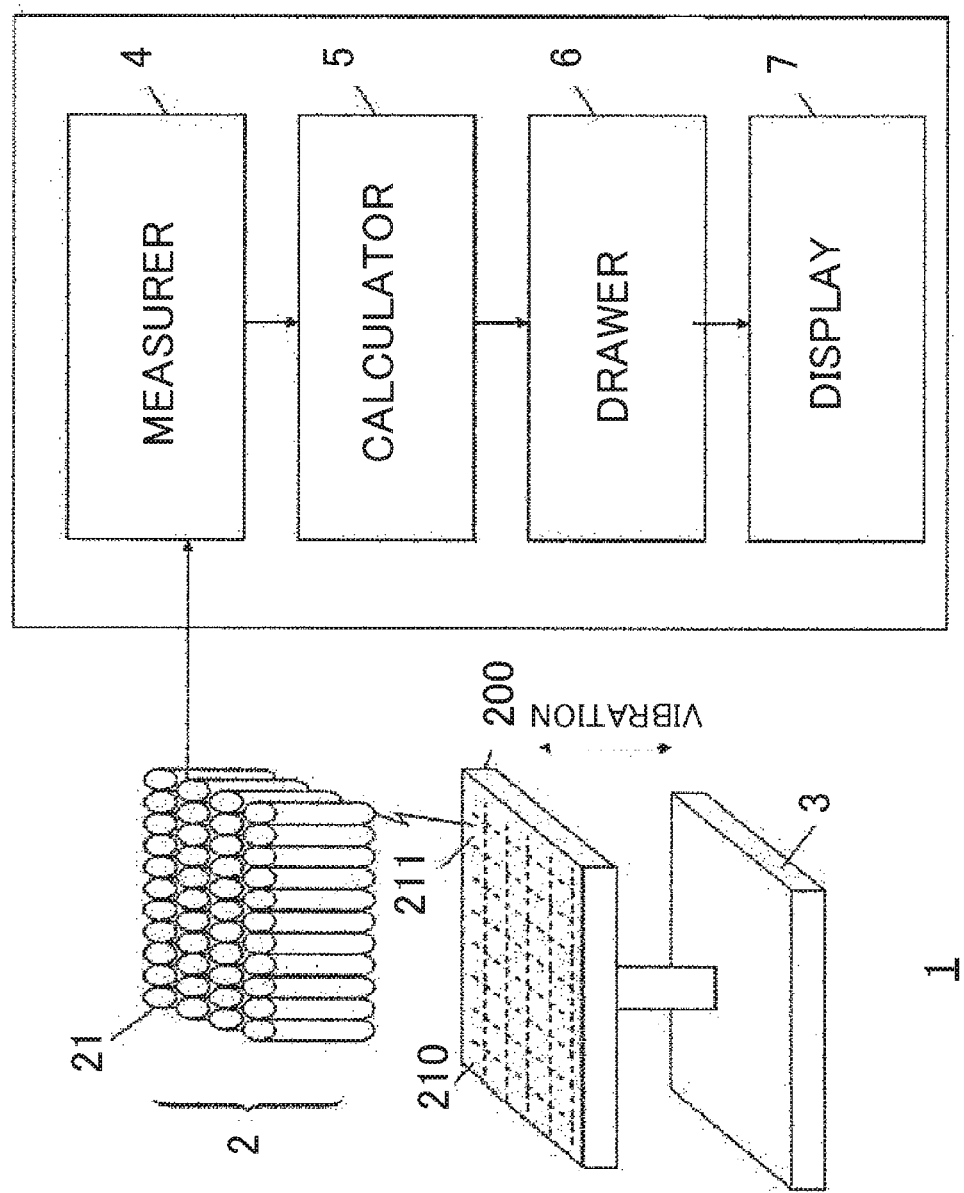
FIG. 7 is a block diagram of a static electricity distribution measuring apparatus according to a second exemplary embodiment of the present disclosure.

FIG. 7 is a block diagram of a static electricity distribution measuring apparatus according to a second exemplary embodiment of the present disclosure. In addition to the same elements as FIG. 4, a display 7 is added. Description is omitted for elements having the same reference signs as in FIG. 4.

The display 7 displays a static electricity distribution diagram (for example, FIG. 6) drawn by the drawer 6. Through this display, the worker can easily understand visually the state of the static electricity distribution on the measurement target 200. For example, the display 7 may be a specialized monitor. Or, when the measurer 4 through drawer 6 are realized by a general-purpose personal computer, the monitor with which the personal computer is provided may fill the role of the display 7.

Because the display 7 is prepared, the worker can not only easily understand visually the static electricity distribution, it is also possible to perform various analyses based on the static electricity distribution diagram displayed. Or, it is possible to work out countermeasures.

Each of the measurer 4 through drawer 6 described in the first exemplary embodiment may be realized with specialized hardware, or may be realized with software. Naturally, it would be fine for these to be realized through a mixture of hardware and software. In addition, for simplicity it would be fine for only the necessary portions in a part of the measurer 4 through the drawer 6 to be realized with specialized hardware and for the remainder to be realized with a personal computer. In this case, the elements in the measurer 4 through the drawer 6 that can be realized with software may be executed as executable software on a personal computer.

For example, a computer program corresponding to the software may be stored in ROM or RAM and executed by a CPU in a personal computer. Through this execution by the CPU, the measurer 4 through the drawer 6 is executed. Following this, the static electricity distribution diagram that was drawn is displayed on the display 7 that is a monitor of the personal computer.

By performing a display in this manner, the static electricity distribution measuring apparatus 1 can make the measured static electricity distribution easily understandable to the worker.

(Weighted Calculation of Amount of Static Electricity)

Next, a scheme for calculating the amount of static electricity in the calculator 5 is described.

The calculator 5 calculates the amount of static electricity of the area 211 based on the intensity of the electric field, as described in the first exemplary embodiment. At this time, there are cases in which the intensity of the electric field receives an influence due to the surrounding environment or the positional relationship between the antenna element 21 and the area 211. In this case, there is a possibility that the intensity of the electric field measured by the measurer 4 is not accurate.

Figure 8:
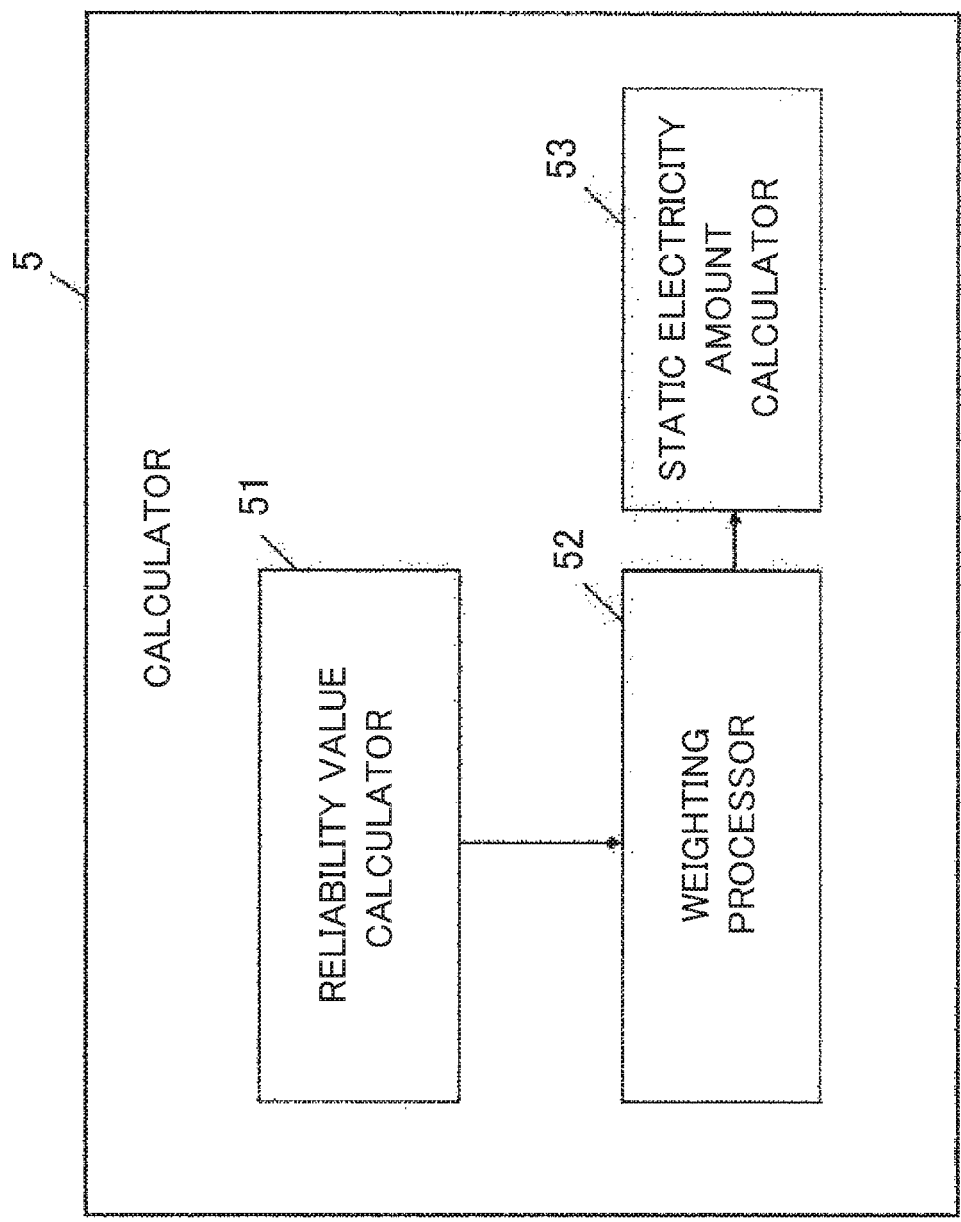
FIG. 8 is an internal block diagram of a calculator according to the second exemplary embodiment of the present disclosure.

The calculator 5 can further improve the precision of calculating the amount of static electricity using a reliability value based on vibration amplitude of the measurement target 200 (or the area 211), in order to further exclude the environmental dependence in receiving the electric field. FIG. 8 is an internal block diagram of a calculator according to the second exemplary embodiment of the present disclosure. FIG. 8 shows a configuration when the calculator 5 improves the precision of calculating the amount of static electricity using a reliability value.

The calculator 5 comprises a reliability value calculator 51, a weighting processor 52 and a static electricity amount calculator 53. The reliability value calculator 51 calculates reliability values, based on vibration amplitude of the measurement target 200. When the vibration amplitude is large, the electric field that reaches the antenna element 21 can be considered to be not receiving much influence from the surrounding environment. On the other hand, when the vibration amplitude is small, the electric field reaching the antenna element 21 is considered to be receiving the influence of the surrounding environment. When the influence of the surrounding environment is received, the influence arises due to noise, fading and/or the like.

The reliability value calculator 51 calculates numerical values that are an index of the reliability value, by comparing the vibration amplitude and a predetermined value. For example, the vibration amplitude can be classified in four steps, and can be classified with value "0" to value "3" from the lowest step to the highest step.

The reliability value calculator 51 outputs the calculated reliability value to the weighting processor 52. The weighting processor 52 performs weighting by multiplying the reliability value by the intensity of the electric field. That is to say, when the reliability value is large (a value of "3" and/or the like), the intensity of the electric field after weighting becomes larger. On the other hand, when the reliability value is small (a value of "1" and/or the like), the intensity of the electric field becomes smaller. The intensity of the electric field is such that the magnitude thereof is corrected in accordance with the reliability value.

The static electricity amount calculator 53 calculates the amount of static electricity based on the post-weighting intensity. FIG. 9 is a table illustrating a relationship between the weighting and the calculated amount of static electricity in the second exemplary embodiment of the present disclosure. The calculator 5 can calculate the amount of static electricity matching the surrounding environment, through weighting in accordance with reliability value, using this table.

The vertical axis of the table indicates the reliability value, and the values "3", "2", "1" and "0" are displayed in order from the highest reliability. The calculator 5, when made up of an electronic circuit, a semiconductor integrated circuit and software, expresses the reliability value with a two-bit signal. The horizontal axis of the table is the intensity of the electric field prior to weighting as measured by the measurer 4, and no special consideration is given to the unit system. The weighting processor 52 applies weighting to the reliability value, on the intensity. The static electricity amount calculator 53 calculates the amount of static electricity based on this weighted intensity. The values recorded in each of the cells of the table are amounts of static electricity calculated by the static electricity amount calculator 53. The unit system is not taken into consideration.

As illustrated by this table, by using reliability values based on vibration amplitudes of the measurement target for weighting of calculation of the amount of static electricity, when the reliability value is low, the amount of static electricity is calculated smaller (or larger). Through this, an amount of static electricity that takes the surrounding environment into consideration is calculated by the calculator 5.

The reliability value calculator 51 calculates reliability values based on the vibration amplitude of the measurement target, but it would be fine to calculate reliability values based on other elements. Average value of vibration amplitude or variance and/or the like can be used. In addition, the table shown in FIG. 9 shows a relationship in which the amount of static electricity becomes smaller the lower the reliability value, but conversely it would be fine for the calculator 5 to calculate the amount of static electricity based on a relationship in which the amount of static electricity becomes larger the lower the reliability value.

As discussed above, the static electricity distribution measuring apparatus 1 according to the second exemplary embodiment can measure the amount of static electricity with high precision taking the surrounding environment into consideration, through reliability values based on elements of the electric field.

(Experiment Results)

Results of experiments conducted by the inventor will be described.

(Level of Antenna Element's Spatial Resolution)

Figure 10:
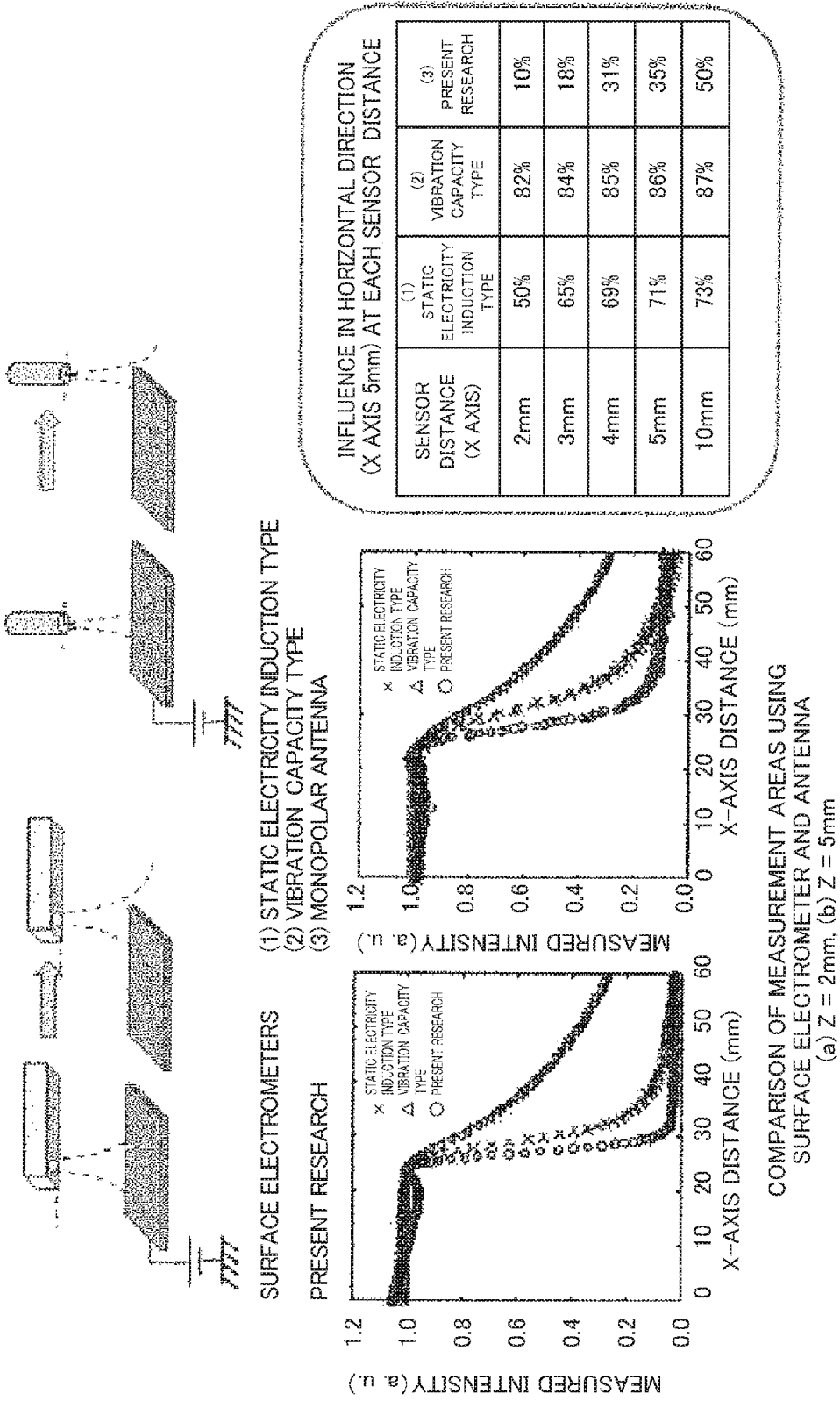
FIG. 10 is experimental results showing the difference between a case of measuring the electric field of a measurement surface of a measurement target with surface electrometers (static electricity induction type, vibration capacity type) in a representative example of prior art, and a case of measuring the electric field of the measurement surface of the measurement target with antenna elements (monopole antennas) according to the present disclosure.

FIG. 10 is experimental results showing the difference between a case of measuring the electric field of a measurement surface of a measurement target with surface electrometers (static electricity induction type, vibration capacity type) in a representative example of prior art, and a case of measuring the electric field of the measurement surface of the measurement target with antenna elements (monopole antennas) according to the present disclosure. The experiment in FIG. 10 was conducted by the inventors.

The upper left side of FIG. 10 shows a state of measuring with a surface electrometer. The upper right side of FIG. 10 shows a state of measuring with a monopole antenna that is an antenna element of the present disclosure. In a case where the distance from the measurement surface is 2 mm and in a case whether this is 5 mm, the slope of the graph in the case of the present disclosure falls sharply. That is to say, it can be understood that little influence is received from electric fields other than in the prescribed area of the measurement surface.

In contrast, with the surface electrometers of the prior art, the slope becomes gentle, so it can be understood that the influence of an electric field other than in the prescribed area of the measurement surface (the area to be measured) is received. In the table on the right side of FIG. 10, the influence from the horizontal direction is shown as a ratio to the distance between the sensor and the measurement surface. As shown in the table on the right side of FIG. 10, for the monopole antenna (displayed as current research in FIG. 10) that is the antenna element of the present disclosure, the influence from the horizontal direction can be seen to be extremely small as a ratio. That is to say, it can be understood that the influence of an electric field other than in the prescribed area of the measurement surface is unlikely to be received.

In this manner, the antenna element 21 of the present disclosure can receive an accurate electric field from each of the areas 211 that finely section the measurement surface 210.

(Accuracy of Calculator and Drawer)

FIG. 11 is an explanatory diagram showing the test status of the static electricity distribution according to the second exemplary embodiment of the present disclosure. The experiment related to FIG. 11 was conducted by the inventors.

In order for the inventors to confirm the accuracy of the static electricity distribution measuring apparatus 1, a plurality of penetrating holes 250 are provided in the measurement target 200, as shown in the photo and the diagram at the bottom left of FIG. 11. The penetrating holes 250 are naturally in a state with no members and thus cannot build up static electricity.

For a measurement target 200 having this kind of penetrating holes 250, through the processes described in the first and second exemplary embodiments, the calculator 5 first calculates the amount of static electricity for each of the areas 211. The results calculated by the calculator 5 are static electricity amount results 500 in the upper right of FIG. 11.

Furthermore, the drawer 6 draws a final static electricity distribution diagram 600 by applying linear correction to the amount of static electricity results 500. As is clear from the static electricity distribution diagram 600, the portions of the penetrating holes 250 have no color (the amount of static electricity is larger the darker the color, and the amount of static electricity is smaller the lighter the color). That is to say, this indicates that static electricity is not building up. As discussed above, because no static electricity is building up in the penetrating holes 250, it can be understood that measurement with the static electricity distribution measuring apparatus 1 can be performed without problem on this point as well.

As described above, from the experiment results as well the precision and certainty of the static electricity distribution measuring apparatus 1 were confirmed.

In addition, the static electricity distribution measuring apparatus described in the first and second exemplary embodiments may also be understood as static electricity distribution measuring methods.

The static electricity distribution measuring apparatus described in the first and second exemplary embodiments is but one example used to explain the overview of the present disclosure, and includes variations and modifications within the scope not deviating from the overview of the present disclosure.

REFERENCE SIGNS LIST

1 Static electricity distribution measuring apparatus
2 Array antenna
21 Antenna element
3 Vibrator
4 Measurer
5 Calculator
6 Drawer
7 Display
200 Measurement target
210 Measurement surface
211 Area

The invention claimed is:

1. A static electricity distribution measuring apparatus for measuring a static electricity distribution on a measurement surface of a measurement target, the static electricity distribution measuring apparatus comprising:
   an array antenna that receives an electric field generated in each of a plurality of areas of the measurement surface through vibration;
   a vibrator that causes the measurement target or the array antenna to vibrate;
   a measurer that measures at least one from among intensity, frequency and phase of the electric field in each of the plurality of areas received by the array antenna;
   a calculator that calculates an amount of static electricity for each of the plurality of areas, based on measurement results by the measurer; and
   a drawer that draws the static electricity distribution on the measurement surface, based on the amount of static electricity in each of the plurality of areas;
   wherein the array antenna comprises a plurality of antenna elements respectively corresponding to the plurality of areas, and
   the calculator calculates the amount of static electricity for each of the plurality of areas by calculating a reliability value based on a vibration amplitude of the measurement target or the array antenna, and weighting the reliability value by an electrical polarity calculated based on the phase of the electric field and the amount of static electricity calculated based on the intensity of the electric field.

2. The static electricity distribution measuring apparatus according to claim 1, wherein the measurement target is a product element of any out of electronic parts, electronic elements, semiconductor integrated elements, electronic substrates, electronic equipment, machinery parts, transportation equipment, chemical products, foodstuffs, paper products, ceramic materials, plastic materials, polymer materials, film products, rubber products, resin products, metal products, pharmaceuticals and textile products, used at a manufacturing site.

3. The static electricity distribution measuring apparatus according to claim 2, wherein the product element flows on a manufacturing line at the manufacturing site.

4. The static electricity distribution measuring apparatus according to claim 1, wherein the plurality of areas are provided virtually in the measurement surface, which is a surface facing the array antenna, in the measurement target.

5. The static electricity distribution measuring apparatus according to claim 4, wherein each of the plurality of areas is sectioned by areas facing the plurality of antenna elements provided in the array antenna.

6. The static electricity distribution measuring apparatus according to claim 5, wherein a surface area of each of the plurality of areas is determined based on a reception directionality of the antenna elements.

7. The static electricity distribution measuring apparatus according to claim 1, wherein the plurality of antenna elements are arranged in a prescribed lattice shape, and each of the plurality of areas is sectioned in correspondence with the prescribed lattice shape, in the measurement target.

8. The static electricity distribution measuring apparatus according to claim 1, wherein each of the plurality of antenna elements possesses directionality convergent on a surface area of the plurality of areas.

9. The static electricity distribution measuring apparatus according to claim 1, wherein the vibrator forms a state in which the measurement target and the array antenna vibrate relative to each other, by causing the measurement target to vibrate while the array antenna is in a fixed state, or by causing the array antenna to vibrate while the measurement target is in a fixed state.

10. The static electricity distribution measuring apparatus according to claim 1, wherein the reliability value is smaller when the vibration amplitude of the array antenna or the measurement target is smaller, and is larger when the vibration amplitude of the measurement target is larger.

11. The static electricity distribution measuring apparatus according to claim 1, further comprising a display that displays the static electricity distribution on the measurement surface drawn by the drawer.

12. A static electricity distribution measuring apparatus for measuring a static electricity distribution on a measurement surface of a measurement target, the static electricity distribution measuring apparatus comprising:
an array antenna that receives an electric field generated in each of a plurality of areas of the measurement surface through vibration;
a vibrator that causes the measurement target or the array antenna to vibrate;
a measurer that measures at least one from among intensity, frequency and phase of the electric field in each of the plurality of areas received by the array antenna;
a calculator that calculates an amount of static electricity for each of the plurality of areas, based on measurement results by the measurer; and
a drawer that draws the static electricity distribution on the measurement surface, based on the amount of static electricity in each of the plurality of areas, wherein:
the array antenna comprises a plurality of antenna elements respectively corresponding to the plurality of areas,
the calculator calculates the amount of static electricity for each of the plurality of areas, as an absolute value of that area, and
the drawer draws the static electricity distribution on the measurement surface of the measurement target by performing a prescribed interpolation on the amount of static electricity as absolute values in each of the plurality of areas.

13. The static electricity distribution measuring apparatus according to claim 12, wherein the prescribed interpolation includes linear interpolation.

14. A static electricity distribution measuring method for measuring a static electricity distribution on a measurement surface of a measurement target, the static electricity distribution measuring method including:
a receiving step of receiving by an array antenna an electric field generated in each of a plurality of areas of the measurement surface through vibration;
a vibration step of causing the measurement target or the array antenna to vibrate;
a measurement step of measuring at least one from among intensity, frequency and phase of the electric field in each of the plurality of areas received by the array antenna;
a calculation step of calculating an amount of static electricity for each of the plurality of areas, based on measurement results by the measurer; and
a drawing step of drawing the static electricity distribution on the measurement target, based on the amount of static electricity in each of the plurality of areas;
wherein the array antenna comprises a plurality of antenna elements respectively corresponding to the plurality of areas, and
in the calculation step, the amount of static electricity for each of the plurality of areas is calculated by calculating a reliability value based on a vibration amplitude of the measurement target or the array antenna, and weighting the reliability value by an electrical polarity calculated based on the phase of the electric field and the amount of static electricity calculated based on the intensity of the electric field.

15. A static electricity distribution measuring method for measuring a static electricity distribution on a measurement surface of a measurement target, the static electricity distribution measuring method including:
a receiving step of receiving by an array antenna an electric field generated in each of a plurality of areas of the measurement surface through vibration;
a vibration step of causing the measurement target or the array antenna to vibrate;
a measurement step of measuring at least one from among intensity, frequency and phase of the electric field in each of the plurality of areas received by the array antenna;
a calculation step of calculating an amount of static electricity for each of the plurality of areas, based on measurement results by the measurer; and
a drawing step of drawing the static electricity distribution on the measurement target, based on the amount of static electricity in each of the plurality of areas;
wherein the array antenna comprises a plurality of antenna elements respectively corresponding to the plurality of areas, in the calculation step, the amount of static electricity for each of the plurality of areas is calculated, as an absolute value of that area; and
in the drawing step, the static electricity distribution on the measurement surface of the measurement target is drawn by performing a prescribed interpolation on the amount of static electricity as absolute values in each of the plurality of areas.

* * * * *